(12) United States Patent
Oh et al.

(10) Patent No.: US 10,882,286 B2
(45) Date of Patent: Jan. 5, 2021

(54) FLEXIBLE DISPLAY WINDOW AND FLEXIBLE DISPLAY INCLUDING THE SAME

(71) Applicant: Samsung Display Co., Ltd., Yongin-si (KR)

(72) Inventors: Hye-Jin Oh, Asan-si (KR); Sang-Il Park, Yongin-si (KR); Heonjung Shin, Hwaseong-si (KR); Jeoungsub Lee, Seoul (KR); Min-Hoon Choi, Seoul (KR); Kyungtae Kim, Asan-si (KR); Boa Kim, Icheon-si (KR); Sanghoon Kim, Hwaseong-si (KR); Hyun-Joon Oh, Seongnam-si (KR); Junghoon Han, Uiwang-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 217 days.

(21) Appl. No.: 16/043,715

(22) Filed: Jul. 24, 2018

(65) Prior Publication Data

US 2019/0039355 A1   Feb. 7, 2019

(30) Foreign Application Priority Data

Aug. 1, 2017   (KR) .................. 10-2017-0097845

(51) Int. Cl.
*B32B 27/08* (2006.01)
*G06F 1/16* (2006.01)
(Continued)

(52) U.S. Cl.
CPC ............ *B32B 27/08* (2013.01); *G06F 1/1652* (2013.01); *B32B 2255/10* (2013.01);
(Continued)

(58) Field of Classification Search
None
See application file for complete search history.

(56) References Cited

U.S. PATENT DOCUMENTS 8,025,958 B2   9/2011   Yamamoto et al.
9,605,159 B2   3/2017   Higano et al.
(Continued)

FOREIGN PATENT DOCUMENTS

| KR | 10-2016-0067319 | 6/2016 |
|----|-----------------|--------|
| KR | 10-2017-0015021 | 2/2017 |
| KR | 10-2017-0016298 | 2/2017 |

OTHER PUBLICATIONS

EPO Extended Search Report dated Dec. 12, 2018, for corresponding European Patent Application No. 18186925.6 (10 pages).

*Primary Examiner* — Chinessa T. Golden
(74) *Attorney, Agent, or Firm* — Lewis Roca Rothgerber Christie LLP

(57) ABSTRACT

A flexible display window includes a flexible base layer including a flexible resin, a first silica nano particle coating layer including full-type silica nano particles, where the first silica nano particle coating layer is disposed on the flexible base layer, a flexible hard coating layer including a flexible hard coating resin, where the flexible hard coating layer is disposed on the first silica nano particle coating layer, and a second silica nano particle coating layer including hollow-type silica nano particles, where the second silica nano particle coating layer is disposed on the flexible hard coating layer. Thus, the flexible display window can enhance impact-resistance of a flexible display while reducing reflectivity of the flexible display.

30 Claims, 14 Drawing Sheets

(51) Int. Cl.
  *H01L 51/00*  (2006.01)
  *H01L 51/52*  (2006.01)
  *G02F 1/1333*  (2006.01)
  *H01L 27/32*  (2006.01)
(52) U.S. Cl.
  CPC ..... *B32B 2255/20* (2013.01); *B32B 2457/202* (2013.01); *B32B 2457/206* (2013.01); *B32B 2457/208* (2013.01); *G02F 1/13338* (2013.01); *G02F 1/133305* (2013.01); *G02F 2201/503* (2013.01); *G02F 2202/36* (2013.01); *G06F 2203/04102* (2013.01); *G06F 2203/04103* (2013.01); *H01L 27/323* (2013.01); *H01L 51/0097* (2013.01); *H01L 51/5237* (2013.01); *H01L 2251/5338* (2013.01); *H01L 2251/5369* (2013.01)

(56) References Cited

U.S. PATENT DOCUMENTS

| | | | |
|---|---|---|---|
| 2007/0237966 A1* | 10/2007 | Takao | C08J 7/0427 428/423.1 |
| 2012/0301676 A1* | 11/2012 | Ushida | G02B 1/16 428/148 |
| 2014/0346451 A1 | 11/2014 | Oh | |
| 2015/0024170 A1 | 1/2015 | Min et al. | |
| 2015/0090969 A1* | 4/2015 | Han | H01L 27/3244 257/40 |
| 2015/0255183 A1 | 9/2015 | Kim et al. | |
| 2016/0024330 A1* | 1/2016 | Jung | G02B 1/11 428/313.9 |
| 2016/0155967 A1 | 6/2016 | Lee et al. | |
| 2016/0306392 A1* | 10/2016 | Park | G02B 1/14 |
| 2017/0092709 A1 | 3/2017 | Choi et al. | |

* cited by examiner

FLEXIBLE DISPLAY WINDOW AND FLEXIBLE DISPLAY INCLUDING THE SAME

CROSS-REFERENCE TO RELATED APPLICATION(S)

This application claims priority to and the benefit of Korean Patent Application No. 10-2017-0097845, filed on Aug. 1, 2017 in the Korean Intellectual Property Office (KIPO), the entire contents of which are incorporated herein by reference.

BACKGROUND

1. Technical Field

Example embodiments relate generally to a flexible display. For example, embodiments of the present disclosure relate to a flexible display window (or, referred to as a foldable display window, a bendable display window, a rollable display window, etc.) included in a flexible display.

2. Description of the Related Art

Recently, many consumers place great importance on a design of an electronic device (e.g., a cellular phone, a smart phone, a smart pad, a computer, a laptop, a television, etc.) in purchasing the electronic device. Thus, many manufacturers try to install a flexible display in an electronic device (e.g., a mobile device). Generally, the flexible display includes a flexible display window, a flexible display panel, a flexible touch panel, etc. Here, to enhance flexibility of the flexible display, the flexible display window, the flexible display panel, the flexible touch panel, etc. may be made of plastic-based materials (e.g., engineering plastic, elastomer, etc.), and a pressure sensitive adhesive (PSA) for forming a neutral plane (e.g., for dispersing a strain) may be used as adhesives disposed between the flexible display window, the flexible display panel, the flexible touch panel, etc. However, as components (e.g., the flexible display window, the flexible display panel, the flexible touch panel, etc.) of the flexible display are made of the plastic-based materials, the flexible display may be vulnerable to external impacts. For example, when a pen drop evaluation of about 2 cm or about less than 1 cm is performed, scratches or cracks may be caused on a surface of a cover window, and bright spots or dark spots may be caused in the display panel. Thus, a flexible display window may include a hard coating layer to enhance impact-resistance. However, the hard coating layer results in increasing reflectivity of the flexible display.

SUMMARY

Some example embodiments provide a flexible display window that can enhance impact-resistance of a flexible display while reducing reflectivity of the flexible display although components (e.g., including the flexible display window) of the flexible display are made of plastic-based materials and the flexible display window includes a hard coating layer.

Some example embodiments provide a flexible display that can achieve reduced reflectivity and enhanced impact-resistance by including the flexible display window.

According to an aspect of example embodiments, a flexible display window may include a flexible base layer including a flexible resin, a first silica nano particle coating layer including full-type silica nano particles, the first silica nano particle coating layer being disposed on the flexible base layer, a flexible hard coating layer including a flexible hard coating resin, the flexible hard coating layer being disposed on the first silica nano particle coating layer, and a second silica nano particle coating layer including hollow-type silica nano particles, the second silica nano particle coating layer being disposed on the flexible hard coating layer.

In example embodiments, the second silica nano particle coating layer may further include the full-type silica nano particles.

In example embodiments, the flexible base layer may have a single-layer structure.

In example embodiments, the flexible base layer may have a multi-layer structure.

In example embodiments, the flexible hard coating layer may have a single-layer structure.

In example embodiments, the flexible hard coating layer may have a multi-layer structure.

In example embodiments, the flexible resin may include at least one selected from a polyethylene terephthalate resin, a polyvinyl chloride resin, a polycarbonate resin, a polyimide resin, a polystyrene resin, a polyacrylate resin, a polyurethane resin, and a silicon resin.

According to another aspect of example embodiments, a flexible display window may include a first flexible base layer including a first flexible resin, a first silica nano particle coating layer including full-type silica nano particles, the first silica nano particle coating layer being disposed on the first flexible base layer, a second flexible base layer including a second flexible resin, the second flexible base layer being disposed on the first silica nano particle coating layer, and a second silica nano particle coating layer including hollow-type silica nano particles, the second silica nano particle coating layer being disposed on the second flexible base layer.

In example embodiments, the second silica nano particle coating layer may further include the full-type silica nano particles.

In example embodiments, the first flexible base layer may have a single-layer structure.

In example embodiments, the first flexible base layer may have a multi-layer structure.

In example embodiments, the second flexible base layer may have a single-layer structure.

In example embodiments, the second flexible base layer may have a multi-layer structure.

According to still another aspect of example embodiments, a flexible display window may include a first flexible base layer including a first flexible resin, a first silica nano particle coating layer including full-type silica nano particles, the first silica nano particle coating layer being disposed on the first flexible base layer, a second flexible base layer including a second flexible resin, the second flexible base layer being disposed on the first silica nano particle coating layer, a flexible hard coating layer including a flexible hard coating resin, the flexible hard coating layer being disposed on the second flexible base layer, and a second silica nano particle coating layer including hollow-type silica nano particles, the second silica nano particle coating layer being disposed on the flexible hard coating layer.

In example embodiments, the second silica nano particle coating layer may further include the full-type silica nano particles.

In example embodiments, the first flexible base layer may have a single-layer structure.

In example embodiments, the first flexible base layer may have a multi-layer structure.

In example embodiments, the second flexible base layer may have a single-layer structure.

In example embodiments, the second flexible base layer may have a multi-layer structure.

In example embodiments, the flexible hard coating layer may have a single-layer structure.

In example embodiments, the flexible hard coating layer may have a multi-layer structure.

According to an aspect of example embodiments, a flexible display may include a flexible display panel, and a flexible display window having a coating structure that includes a first silica nano particle coating layer including full-type silica nano particles and a second silica nano particle coating layer including hollow-type silica nano particles, the flexible display window being disposed on the flexible display panel.

In example embodiments, the flexible display may further include a flexible touch panel disposed between the flexible display panel and the flexible display window or disposed under the flexible display panel.

In example embodiments, the flexible display panel, the flexible touch panel, and the flexible display window may be stacked using pressure sensitive adhesives.

In example embodiments, the flexible display window may include a flexible base layer including a flexible resin, the first silica nano particle coating layer disposed on the flexible base layer, a flexible hard coating layer including a flexible hard coating resin, the flexible hard coating layer being disposed on the first silica nano particle coating layer, and the second silica nano particle coating layer disposed on the flexible hard coating layer.

In example embodiments, the second silica nano particle coating layer may further include the full-type silica nano particles.

In example embodiments, the flexible display window may include a first flexible base layer including a first flexible resin, the first silica nano particle coating layer disposed on the first flexible base layer, a second flexible base layer including a second flexible resin, the second flexible base layer being disposed on the first silica nano particle coating layer, and the second silica nano particle coating layer disposed on the second flexible base layer.

In example embodiments, the second silica nano particle coating layer may further include the full-type silica nano particles.

In example embodiments, the flexible display window may include a first flexible base layer including a first flexible resin, the first silica nano particle coating layer disposed on the first flexible base layer, a second flexible base layer including a second flexible resin, the second flexible base layer being disposed on the first silica nano particle coating layer, a flexible hard coating layer including a flexible hard coating resin, the flexible hard coating layer being disposed on the second flexible base layer, and the second silica nano particle coating layer disposed on the flexible hard coating layer.

In example embodiments, the second silica nano particle coating layer may further include the full-type silica nano particles.

Therefore, a flexible display window according to example embodiments may have a coating structure in which a first silica nano particle coating layer including full-type silica nano particles and a second silica nano particle coating layer including hollow-type silica nano particles are stacked with a set (or specific) layer (e.g., a flexible hard coating layer and/or another flexible base layer) interposed therebetween, where the first and second silica nano particle coating layers are disposed over a flexible base layer. Thus, although components (e.g., including the flexible display window) of a flexible display are made of plastic-based materials and the flexible display window includes a hard coating layer, the flexible display window may enhance impact-resistance of the flexible display while reducing reflectivity of the flexible display based on the first silica nano particle coating layer including the full-type silica nano particles and the second silica nano particle coating layer including the hollow-type silica nano particles.

In addition, a flexible display including the flexible display window according to example embodiments may achieve reduced reflectivity and enhanced impact-resistance due to the presence of the first silica nano particle coating layer including the full-type silica nano particles and the second silica nano particle coating layer including the hollow-type silica nano particles.

BRIEF DESCRIPTION OF THE DRAWINGS

Illustrative, non-limiting example embodiments will be more clearly understood from the following detailed description taken in conjunction with the accompanying drawings.

DETAILED DESCRIPTION

Hereinafter, embodiments of the present disclosure will be explained in more detail with reference to the accompanying drawings.

Figure 1:
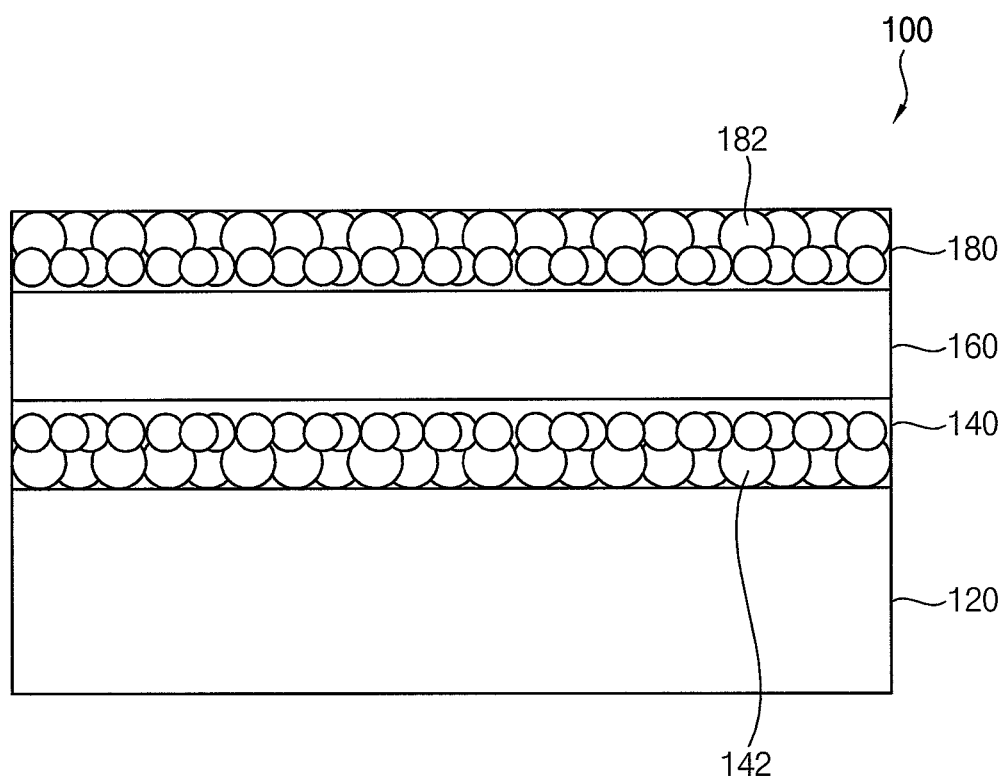
FIG. 1 is a cross-sectional diagram illustrating a flexible display window according to example embodiments.
Figure 2:
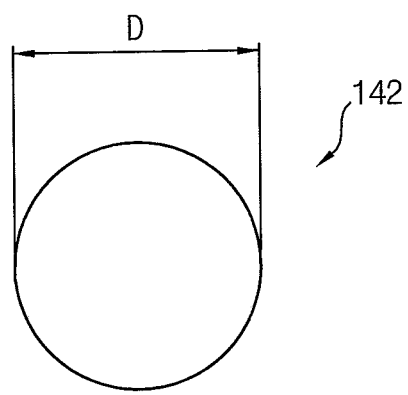
FIG. 2 is a diagram illustrating a full-type silica nano particle included in a first silica nano particle coating layer of the flexible display window of FIG. 1.
Figure 3:
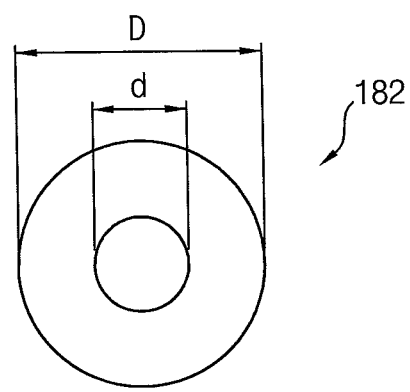
FIG. 3 is a diagram illustrating a hollow-type silica nano particle included in a second silica nano particle coating layer of the flexible display window of FIG. 1.
Figure 4:
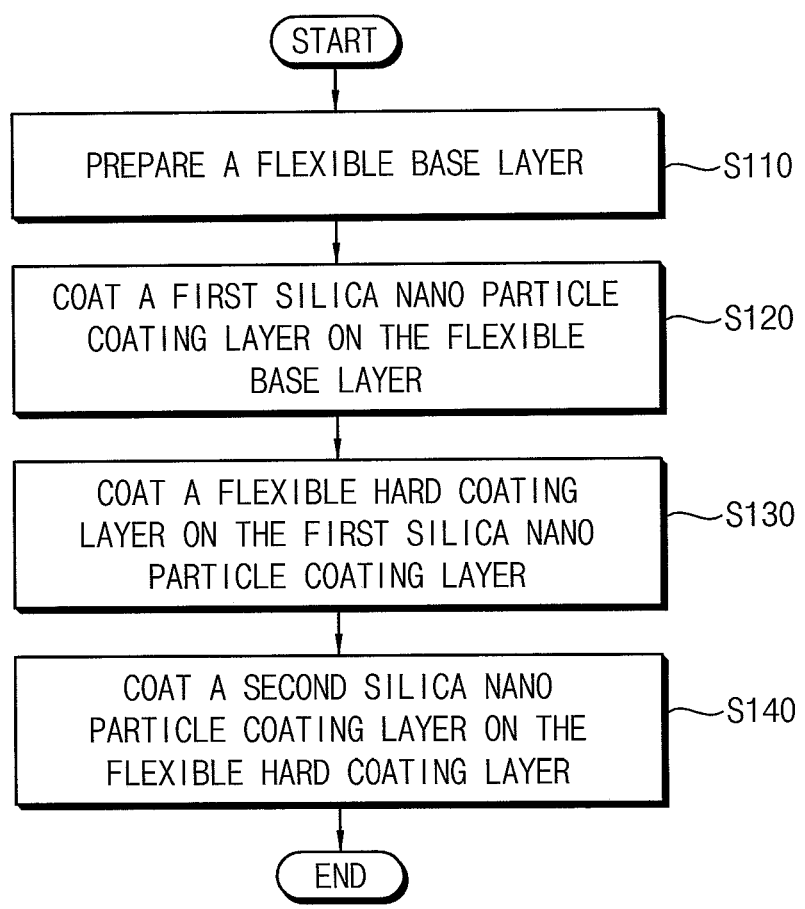
FIG. 4 is a flow chart illustrating an example in which the flexible display window of FIG. 1 is manufactured.

FIG. 1 is a cross-sectional diagram illustrating a flexible display window according to example embodiments. FIG. 2 is a diagram illustrating a full-type silica nano particle included in a first silica nano particle coating layer of the flexible display window of FIG. 1. As used herein, the term "full-type silica" refers to a solid silica particle that includes silica throughout the particle. FIG. 3 is a diagram illustrating a hollow-type silica nano particle included in a second silica nano particle coating layer of the flexible display window of FIG. 1. As used herein, the term "hollow-type silica nano particle" refers to a silica refers to a nanoparticle having an empty space at an interior of the nano particle. FIG. 4 is a flow chart illustrating an example in which the flexible display window of FIG. 1 is manufactured.

Referring to FIGS. 1-4, the flexible display window 100 may include a flexible base layer 120, a first silica nano particle coating layer 140, a flexible hard coating layer 160, and a second silica nano particle coating layer 180. For example, the flexible display window 100 may be manufactured to have an entire (e.g., total) transmittance of more than 90% of visible light (e.g., light having a wavelength at, in, or across a range between and including 380 nm and 780 nm) and a haze of less than 1%.

The flexible base layer 120 may include a flexible resin to be flexible. Thus, the flexible base layer 120 may be made of plastic-based materials (e.g., engineering plastic, elastomer, etc.) having excellent optical characteristics, excellent mechanical hardness, excellent flexibility, and excellent elastic resilience (e.g., elastic recovery). For example, the flexible resin of the flexible base layer 120 may include at least one selected from a polyethylene terephthalate resin, a polyvinyl chloride resin, a polycarbonate resin, a polyimide resin, a polystyrene resin, a polyacrylate resin, a polyurethane resin, and a silicon resin. In example embodiments, the flexible base layer 120 may have thickness of less than 200 µm. However, the thickness of the flexible base layer 120 is not limited thereto. In an example embodiment, the flexible base layer 120 may have a single-layer structure. In other words, the flexible base layer 120 may include one base layer. In this case, thickness of the base layer may be less than 200 µm. In another example embodiment, the flexible base layer 120 may have a multi-layer structure. In other words, the flexible base layer 120 may include two or more base layers. In this case, thickness of each of the base layers may be less than 50 µm, and entire thickness (e.g., the total thickness) of the base layers may be less than 200 µm.

The first silica nano particle coating layer 140 may be disposed on the flexible base layer 120. Here, the first silica nano particle coating layer 140 may include full-type silica nano particles 142. For example, as illustrated in FIG. 2, the full-type silica nano particle 142 included in the first silica nano particle coating layer 140 may be a spherical (e.g., substantially spherical) particle of which the inside is fully filled (e.g., the particle is solid and does not include an empty space at the interior). For example, the full-type silica nano particle 142 may be a silica nano particle of which the inside corresponding to a diameter D is fully filled with silica materials. Thus, the full-type silica nano particle 142 may have high elastic modulus and high hardness. In an example embodiment, the diameters D of the full-type silica nano particles 142 included in the first silica nano particle coating layer 140 may not be uniform. In another example embodiment, the diameters D of the full-type silica nano particles 142 included in the first silica nano particle coating layer 140 may be uniform (e.g., substantially uniform). In an example embodiment, the first silica nano particle coating layer 140 may be formed by coating a binder including the full-type silica nano particles 142 on the flexible base layer 120. In other words, the first silica nano particle coating layer 140 may include the full-type silica nano particles 142 distributed on the flexible base layer 120 and the binder for binding the full-type silica nano particles 142. For example, the binder may include an acrylic compound, a urethane compound, a silicon compound, or a combination thereof. Here, the binder may have relatively high fluidity. In this case, the first silica nano particle coating layer 140 may have thickness between 0.01 µm and 0.1 µm. However, the thickness of the first silica nano particle coating layer 140 is not limited thereto.

As described above, since the first silica nano particle coating layer 140 includes the full-type silica nano particles 142 having the high elastic modulus and the high hardness and the binder having the relatively high fluidity, an external impact applied to the first silica nano particle coating layer 140 may be first applied to the full-type silica nano particles 142. Then, the impact applied to the full-type silica nano particles 142 may be absorbed and/or dispersed by the binder. Thus, the degree to which the external impact applied to the first silica nano particle coating layer 140 is transferred to layers disposed under the first silica nano particle coating layer 140 may be reduced (or, minimized). As a result, the impact-resistance of the flexible display window 100 may be enhanced by the first silica nano particle coating layer 140. As described above, since the first silica nano particle coating layer 140 is included in the flexible display window 100 for enhancing the impact-resistance of the flexible display window 100, the first silica nano particle coating layer 140 may include the full-type silica nano particles 142. On the other hand, as described below, since the second silica nano particle coating layer 180 is included in the flexible display window 100 for reducing the reflectivity of the flexible display window 100 as well as enhancing the impact-resistance of the flexible display window 100, the second silica nano particle coating layer 180 may include the hollow-type silica nano particles 182.

The flexible hard coating layer 160 may be disposed on the first silica nano particle coating layer 140. Here, the flexible hard coating layer 160 may include a flexible hard coating resin. For example, the flexible hard coating resin may include an acrylic compound, a urethane compound, a silicon compound, or a combination thereof. In some example embodiments, the flexible hard coating layer 160 may be formed by a dipping coating method, a spin coating method, a spray coating method, a vacuum evaporation method, etc. In example embodiments, the flexible hard coating layer 160 may have a stretch ratio of more than 5%. In an example embodiment, the flexible hard coating layer 160 may have a single-layer structure. For example, the flexible hard coating layer 160 may include one coating layer. In another example embodiment, the flexible hard coating layer 160 may have a multi-layer structure. For example, the flexible hard coating layer 160 may include two or more coating layers. In this case, an upper coating layer of the flexible hard coating layer 160 may have thickness between 5 µm and 10 µm, a lower coating layer of the flexible hard coating layer 160 may have thickness of less than 5 μm, and the flexible hard coating layer 160 may have thickness between 5 μm and 50 μm. However, the thickness of the flexible hard coating layer 160 is not limited thereto.

The second silica nano particle coating layer 180 may be disposed on the flexible hard coating layer 160. Here, the second silica nano particle coating layer 180 may include hollow-type silica nano particles 182. For example, as illustrated in FIG. 3, the hollow-type silica nano particle 182 included in the second silica nano particle coating layer 180 may be a spherical (e.g., substantially spherical) particle of which the inside is not fully filled. For example, the hollow-type silica nano particle 182 may be a silica nano particle having an empty space corresponding to a diameter d. For example, the inside of the hollow-type silica nano particle 182 corresponding to a diameter D is partially filled with the silica materials, such that the inside corresponding to the diameter d is not filled with the silica materials. Since light refraction occurs due to the empty space in the hollow-type silica nano particle 182, the second silica nano particle coating layer 180 including the hollow-type silica nano particles 182 may reduce the reflectivity of the flexible display window 100. In addition, since the hollow-type silica nano particle 182 has high elastic modulus and high hardness, where the elastic modulus and hardness of the hollow-type silica nano particle 182 is lower than those of the full-type silica nano particle 142, the second silica nano particle coating layer 180 including the hollow-type silica nano particles 182 may enhance the impact-resistance of the flexible display window 100. In an example embodiment, the diameters D of the hollow-type silica nano particles 182 included in the second silica nano particle coating layer 180 may not be uniform. In addition, the diameters d of the empty spaces of the hollow-type silica nano particles 182 included in the second silica nano particle coating layer 180 may not be uniform. In another example embodiment, the diameters D of the hollow-type silica nano particles 182 included in the second silica nano particle coating layer 180 may be uniform (e.g., substantially uniform). In addition, the diameters d of the empty spaces of the hollow-type silica nano particles 182 included in the second silica nano particle coating layer 180 may be uniform (e.g., substantially uniform).

In an example embodiment, the second silica nano particle coating layer 180 may be formed by coating a binder including the hollow-type silica nano particles 182 on the flexible hard coating layer 160. In other words, the second silica nano particle coating layer 180 may include the hollow-type silica nano particles 182 distributed on the flexible hard coating layer 160 and the binder for binding the hollow-type silica nano particles 182. For example, the binder may include an acrylic compound, a urethane compound, a silicon compound, or a combination thereof. Here, the binder may have relatively high fluidity. In this case, the second silica nano particle coating layer 180 may have a thickness between 0.01 μm and 0.1 μm. However, the thickness of the second silica nano particle coating layer 180 is not limited thereto. As described above, since the second silica nano particle coating layer 180 includes the hollow-type silica nano particles 182 having the high elastic modulus and the high hardness and the binder having the relatively high fluidity, an external impact applied to the second silica nano particle coating layer 180 may be first applied to the hollow-type silica nano particles 182. Then, the impact applied to the hollow-type silica nano particles 182 may be absorbed and/or dispersed by the binder. Thus, the degree to which the external impact applied to the second silica nano particle coating layer 180 is transferred to layers disposed under the second silica nano particle coating layer 180 may be reduced (or, minimized). As a result, the impact-resistance of the flexible display window 100 may be enhanced by the second silica nano particle coating layer 180.

In addition, when incident light enters into the hollow-type silica nano particle 182, a traveling direction of the incident light may be changed due to a difference between a refractive index of the empty space of the hollow-type silica nano particle 182 and a refractive index of a body of the hollow-type silica nano particle 182 surrounding the empty space of the hollow-type silica nano particle 182. For example, because the hollow-type silica nano particle 182 causes the light refraction, the second silica nano particle coating layer 180 may act as an anti-reflection film and/or an anti-glare film. Furthermore, some or all of the hollow-type silica nano particles 182 of the second silica nano particle coating layer 180 may be exposed to the outside. Thus, when an object contacts the second silica nano particle coating layer 180, the hollow-type silica nano particles 182 may prevent the object from directly contacting the binder of the second silica nano particle coating layer 180 (or may reduce a likelihood or amount of such contact). As a result, a mark (e.g., a fingerprint mark, etc.) may not remain on a surface of the flexible display window 100 (e.g., on the second silica nano particle coating layer 180). In other words, the second silica nano particle coating layer 180 may act as a fingerprint resistance film and/or a protection film. In an example embodiment, in order to further enhance the impact-resistance of the flexible display window 100, the second silica nano particle coating layer 180 may further include the full-type silica nano particles 142, where the full-type silica nano particle 142 has the elastic modulus and the hardness higher than those of the hollow-type silica nano particle 182. For example, the second silica nano particle coating layer 180 may include both the hollow-type silica nano particles 182 and the full-type silica nano particles 142.

In brief, the flexible display window 100 may have a coating structure in which the first silica nano particle coating layer 140 including the full-type silica nano particles 142 and the second silica nano particle coating layer 180 including the hollow-type silica nano particles 182 are stacked with the flexible hard coating layer 160 interposed therebetween, where the first and second silica nano particle coating layers 140 and 180 are disposed over the flexible base layer 120. Thus, although components (e.g., including the flexible display window 100) of the flexible display are made of the plastic-based materials and the flexible display window 100 includes a hard coating layer, the flexible display window 100 may enhance the impact-resistance of the flexible display while reducing the reflectivity of the flexible display based on the first silica nano particle coating layer 140 including the full-type silica nano particles 142 and the second silica nano particle coating layer 180 including the hollow-type silica nano particles 182. In example embodiments, as illustrated in FIG. 4, the flexible display window 100 may be manufactured by preparing the flexible base layer 120 (S110), by coating (or, disposing) the first silica nano particle coating layer 140 on the flexible base layer 120 (S120), by coating the flexible hard coating layer 160 on the first silica nano particle coating layer 140 (S130), and by coating the second silica nano particle coating layer 180 on the flexible hard coating layer 160 (S140). Since the above-described method is an example, a method of manufacturing the flexible display window 100 may be changed according to requirements or as desired.

Figure 5:
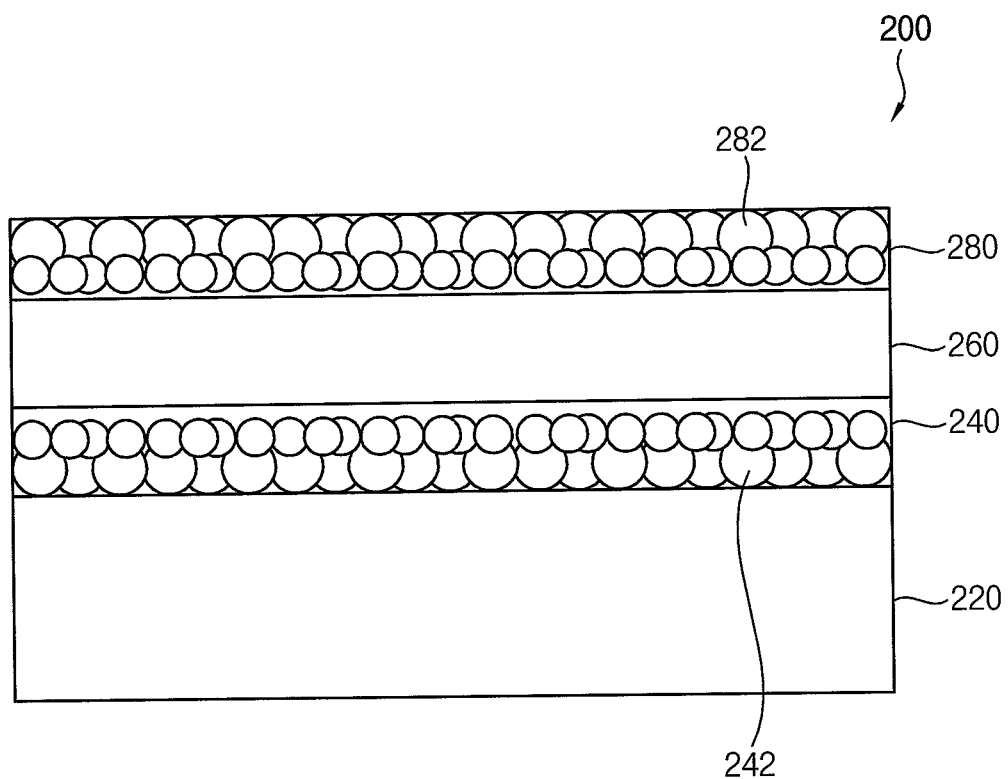
FIG. 5 is a cross-sectional diagram illustrating a flexible display window according to example embodiments.
Figure 6:
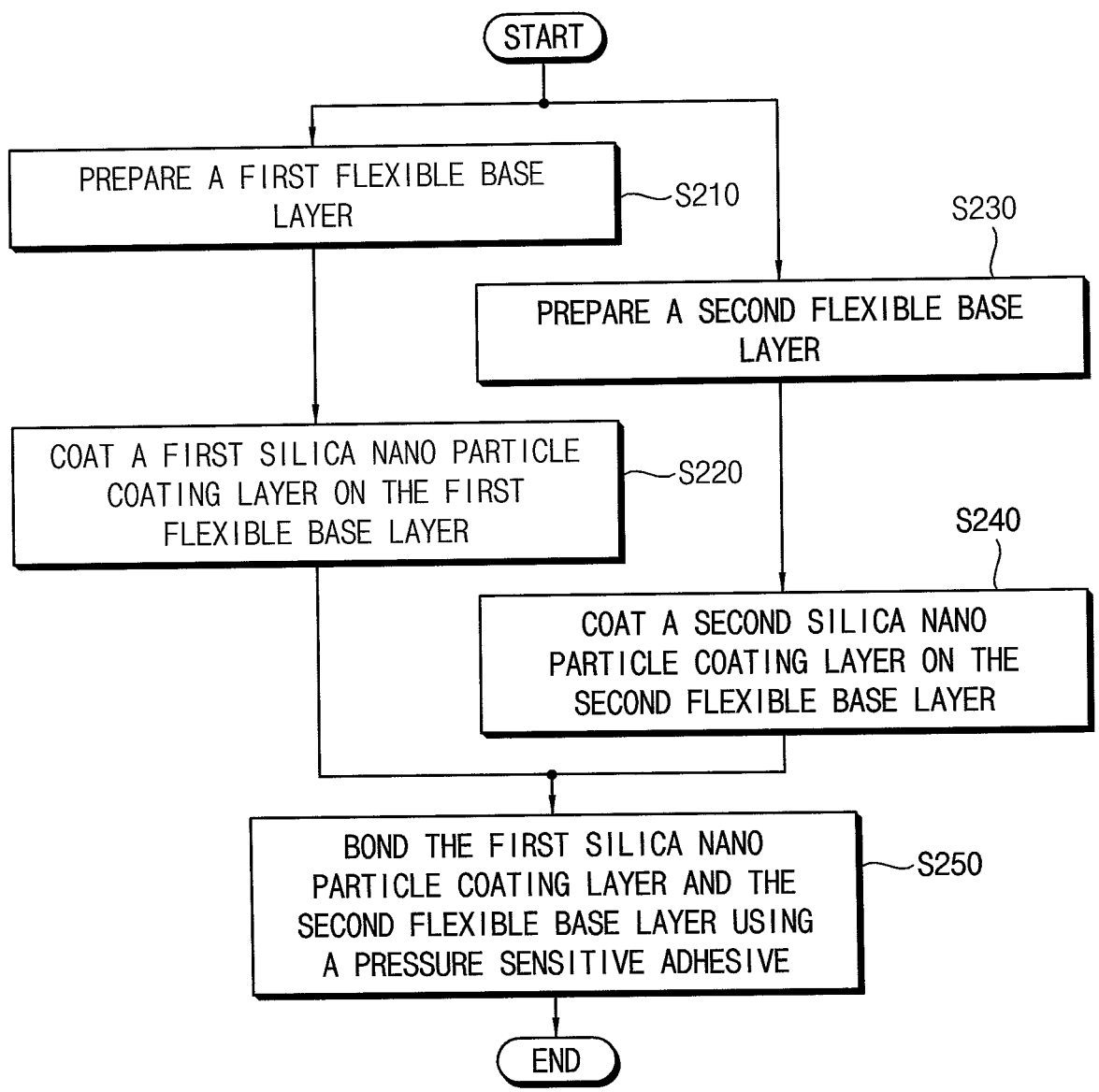
FIG. 6 is a flow chart illustrating an example in which the flexible display window of FIG. 5 is manufactured.
Figure 7:
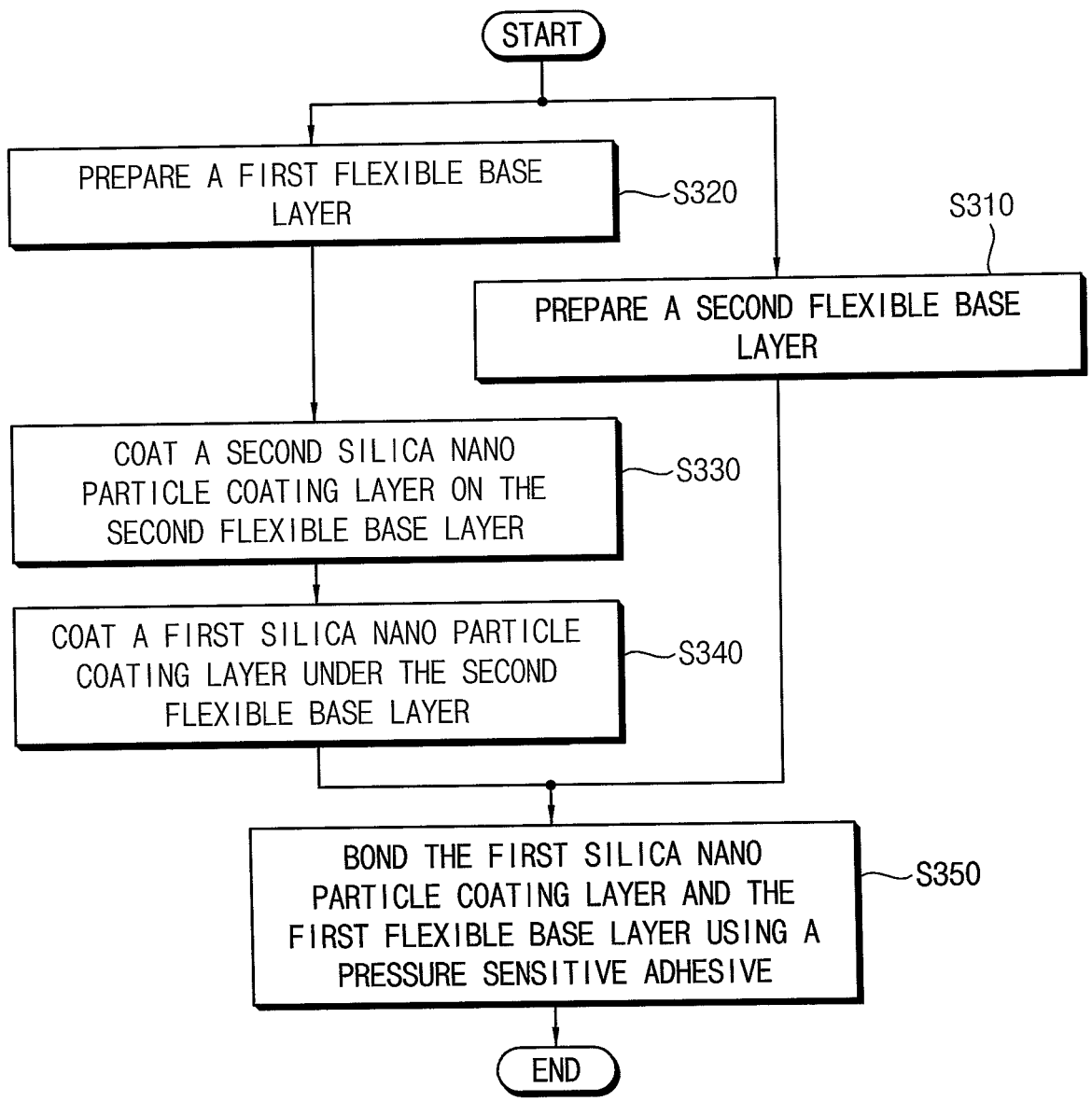
FIG. 7 is a flow chart illustrating another example in which the flexible display window of FIG. 5 is manufactured.

FIG. 5 is a cross-sectional diagram illustrating a flexible display window according to example embodiments. FIG. 6 is a flow chart illustrating an example in which the flexible display window of FIG. 5 is manufactured. FIG. 7 is a flow chart illustrating another example in which the flexible display window of FIG. 5 is manufactured.

Referring to FIGS. 5-7, the flexible display window 200 may include a first flexible base layer 220, a first silica nano particle coating layer 240, a second flexible base layer 260, and a second silica nano particle coating layer 280. For example, the flexible display window 200 may be manufactured to have an entire (e.g., a total) transmittance of more than 90% of visible light and a haze of less than 1%.

The first flexible base layer 220 may include a first flexible resin to be flexible. Thus, the first flexible base layer 220 may be made of plastic-based materials having excellent optical characteristics, excellent mechanical hardness, excellent flexibility, and excellent elastic resilience. For example, the first flexible resin of the first flexible base layer 220 may include at least one selected from a polyethylene terephthalate resin, a polyvinyl chloride resin, a polycarbonate resin, a polyimide resin, a polystyrene resin, a polyacrylate resin, a polyurethane resin, and a silicon resin. In example embodiments, the first flexible base layer 220 may have thickness of less than 200 µm. However, the thickness of the first flexible base layer 220 is not limited thereto. In an example embodiment, the first flexible base layer 220 may have a single-layer structure. In other words, the first flexible base layer 220 may include one base layer. In this case, thickness of the base layer may be less than 200 µm. In another example embodiment, the first flexible base layer 220 may have a multi-layer structure. In other words, the first flexible base layer 220 may include two or more base layers. In this case, thickness of each of the base layers may be less than 50 µm, and the entire (e.g., total) thickness of the base layers may be less than 200 µm.

The first silica nano particle coating layer 240 may be disposed on the first flexible base layer 220. Here, the first silica nano particle coating layer 240 may include full-type silica nano particles 242. For example, the full-type silica nano particle 242 included in the first silica nano particle coating layer 240 may be a spherical (e.g., substantially spherical) particle of which the inside is fully filled. Thus, the full-type silica nano particle 242 may have high elastic modulus and high hardness. In an example embodiment, diameters of the full-type silica nano particles 242 included in the first silica nano particle coating layer 240 may not be uniform. In another example embodiment, the diameters of the full-type silica nano particles 242 included in the first silica nano particle coating layer 240 may be uniform (e.g., substantially uniform). In an example embodiment, the first silica nano particle coating layer 240 may be formed by coating a binder including the full-type silica nano particles 242 on the first flexible base layer 220. In other words, the first silica nano particle coating layer 240 may include the full-type silica nano particles 242 distributed on the first flexible base layer 220 and the binder for binding the full-type silica nano particles 242. For example, the binder may include an acrylic compound, a urethane compound, a silicon compound, or a combination thereof. Here, the binder may have relatively high fluidity. In this case, the first silica nano particle coating layer 240 may have thickness between 0.01 µm and 0.1 µm. However, the thickness of the first silica nano particle coating layer 240 is not limited thereto.

As described above, since the first silica nano particle coating layer 240 includes the full-type silica nano particles 242 having the high elastic modulus and the high hardness and the binder having the relatively high fluidity, an external impact applied to the first silica nano particle coating layer 240 may be first applied to the full-type silica nano particles 242. Then, the impact applied to the full-type silica nano particles 242 may be absorbed and/or dispersed by the binder. Thus, the degree to which the external impact applied to the first silica nano particle coating layer 240 is transferred to layers disposed under the first silica nano particle coating layer 240 may be reduced (or, minimized). As a result, the impact-resistance of the flexible display window 200 may be enhanced by the first silica nano particle coating layer 240. As described above, since the first silica nano particle coating layer 240 is included in the flexible display window 200 for enhancing the impact-resistance of the flexible display window 200, the first silica nano particle coating layer 240 may include the full-type silica nano particles 242. On the other hand, as described below, since the second silica nano particle coating layer 280 is included in the flexible display window 200 for reducing the reflectivity of the flexible display window 200 as well as enhancing the impact-resistance of the flexible display window 200, the second silica nano particle coating layer 280 may include the hollow-type silica nano particles 282.

The second flexible base layer 260 may be disposed on the first silica nano particle coating layer 240. Here, the second flexible base layer 260 may include a second flexible resin to be flexible. Thus, the second flexible base layer 260 may be made of plastic-based materials having excellent optical characteristics, excellent mechanical hardness, excellent flexibility, and excellent elastic resilience. For example, the second flexible resin of the second flexible base layer 260 may include at least one selected from a polyethylene terephthalate resin, a polyvinyl chloride resin, a polycarbonate resin, a polyimide resin, a polystyrene resin, a polyacrylate resin, a polyurethane resin, and a silicon resin. In an example embodiment, the second flexible resin of the second flexible base layer 260 may be different from the first flexible resin of the first flexible base layer 220. In another example embodiment, the second flexible resin of the second flexible base layer 260 may be identical to the first flexible resin of the first flexible base layer 220. In example embodiments, the second flexible base layer 260 may have thickness of less than 50 µm. However, the thickness of the second flexible base layer 260 is not limited thereto. In an example embodiment, the second flexible base layer 260 may have a single-layer structure. In other words, the second flexible base layer 260 may include one base layer. In this case, thickness of the base layer may be less than 50 µm. In another example embodiment, the second flexible base layer 260 may have a multi-layer structure. In other words, the second flexible base layer 260 may include two or more base layers. In this case, the entire (e.g., total) thickness of the base layers may be less than 50 µm. As compared to the flexible display window 100 of FIG. 1, the flexible display window 200 of FIG. 5 may include the second flexible base layer 260 instead of the flexible hard coating layer 160 included in the flexible display window 100 of FIG. 1. Here, the second flexible base layer 260 included in the flexible display window 200 of FIG. 5 may act as the flexible hard coating layer 160 included in the flexible display window 100 of FIG. 1.

The second silica nano particle coating layer 280 may be disposed on the second flexible base layer 260. Here, the second silica nano particle coating layer 280 may include hollow-type silica nano particles 282. For example, the hollow-type silica nano particle 282 included in the second silica nano particle coating layer 280 may be a spherical (e.g., substantially spherical) particle of which the inside is not fully filled. For example, the hollow-type silica nano particle 282 may be a silica nano particle having an empty space corresponding to a set (or specific) diameter. Since light refraction occurs due to the empty space in the hollow-type silica nano particle 282, the second silica nano particle coating layer 280 including the hollow-type silica nano particles 282 may reduce the reflectivity of the flexible display window 200. In addition, since the hollow-type silica nano particle 282 has high elastic modulus and high hardness, where the elastic modulus and hardness of the hollow-type silica nano particle 282 is lower than those of the full-type silica nano particle 242, the second silica nano particle coating layer 280 including the hollow-type silica nano particles 282 may enhance the impact-resistance of the flexible display window 200. In an example embodiment, the diameters of the hollow-type silica nano particles 282 included in the second silica nano particle coating layer 280 may not be uniform. In addition, the diameters of the empty spaces of the hollow-type silica nano particles 282 included in the second silica nano particle coating layer 280 may not be uniform. In another example embodiment, the diameters of the hollow-type silica nano particles 282 included in the second silica nano particle coating layer 280 may be uniform (e.g., substantially uniform). In addition, the diameters of the empty spaces of the hollow-type silica nano particles 282 included in the second silica nano particle coating layer 280 may be uniform (e.g., substantially uniform).

In an example embodiment, the second silica nano particle coating layer 280 may be formed by coating a binder including the hollow-type silica nano particles 282 on the second flexible base layer 260. In other words, the second silica nano particle coating layer 280 may include the hollow-type silica nano particles 282 distributed on the second flexible base layer 260 and the binder for binding the hollow-type silica nano particles 282. For example, the binder may include an acrylic compound, a urethane compound, a silicon compound, or a combination thereof. Here, the binder may have relatively high fluidity. In this case, the second silica nano particle coating layer 280 may have thickness between 0.01 μm and 0.1 μm. However, the thickness of the second silica nano particle coating layer 280 is not limited thereto. As described above, since the second silica nano particle coating layer 280 includes the hollow-type silica nano particles 282 having the high elastic modulus and the high hardness and the binder having the relatively high fluidity, an external impact applied to the second silica nano particle coating layer 280 may be first applied to the hollow-type silica nano particles 282. Then, the impact applied to the hollow-type silica nano particles 282 may be absorbed and/or dispersed by the binder. Thus, the degree to which the external impact applied to the second silica nano particle coating layer 280 is transferred to layers disposed under the second silica nano particle coating layer 280 may be reduced (or, minimized). As a result, the impact-resistance of the flexible display window 200 may be enhanced by the second silica nano particle coating layer 280.

In addition, when incident light enters into the hollow-type silica nano particle 282, a traveling direction of the incident light may be changed due to a difference between a refractive index of the empty space of the hollow-type silica nano particle 282 and a refractive index of a body of the hollow-type silica nano particle 282 surrounding the empty space of the hollow-type silica nano particle 282. For example, because the hollow-type silica nano particle 282 causes the light refraction, the second silica nano particle coating layer 280 may act as an anti-reflection film and/or an anti-glare film. Furthermore, some or all of the hollow-type silica nano particles 282 of the second silica nano particle coating layer 280 may be exposed to the outside. Thus, when an object contacts the second silica nano particle coating layer 280, the hollow-type silica nano particles 282 may prevent the object from directly contacting the binder of the second silica nano particle coating layer 280 (or may reduce a likelihood or amount of such contact). As a result, a mark may not remain on a surface of the flexible display window 200 (e.g., on the second silica nano particle coating layer 280). In other words, the second silica nano particle coating layer 280 may act as a fingerprint resistance film and/or a protection film. In an example embodiment, in order to further enhance the impact-resistance of the flexible display window 200, the second silica nano particle coating layer 280 may further include the full-type silica nano particles 242, where the full-type silica nano particle 242 has the elastic modulus and the hardness higher than those of the hollow-type silica nano particle 282. For example, the second silica nano particle coating layer 280 may include both the hollow-type silica nano particles 282 and the full-type silica nano particles 242.

In brief, the flexible display window 200 may have a coating structure in which the first silica nano particle coating layer 240 including the full-type silica nano particles 242 and the second silica nano particle coating layer 280 including the hollow-type silica nano particles 282 are stacked with the second flexible base layer 260 interposed therebetween, where the first and second silica nano particle coating layers 240 and 280 are disposed over the first flexible base layer 220. Thus, although components (e.g., including the flexible display window 200) of the flexible display are made of the plastic-based materials and the flexible display window 200 includes a hard coating layer, the flexible display window 200 may enhance the impact-resistance of the flexible display while reducing the reflectivity of the flexible display based on the first silica nano particle coating layer 240 including the full-type silica nano particles 242 and the second silica nano particle coating layer 280 including the hollow-type silica nano particles 282. In an example embodiment, as illustrated in FIG. 6, the flexible display window 200 may be manufactured by preparing the first flexible base layer 220 (S210), by coating the first silica nano particle coating layer 240 on the first flexible base layer 220 (S220), by preparing the second flexible base layer 260 (S230), by coating the second silica nano particle coating layer 280 on the second flexible base layer 260 (S240), and by bonding the first silica nano particle coating layer 240 and the second flexible base layer 260 using a pressure sensitive adhesive (PSA) (S250). In another example embodiment, as illustrated in FIG. 7, the flexible display window 200 may be manufactured by preparing the first flexible base layer 220 (S310), by preparing the second flexible base layer 260 (S320), by coating the second silica nano particle coating layer 280 on the second flexible base layer 260 (S330), by coating the first silica nano particle coating layer 240 under the second flexible base layer 260 (S340), and by bonding the first silica nano particle coating layer 240 and the first flexible base layer 220 using a pressure sensitive adhesive (S350). Here, the Step S340 may be performed before the Step S330. Since the above-described methods are examples, a method of manufacturing the flexible display window 200 may be changed according to requirements.

Figure 8:
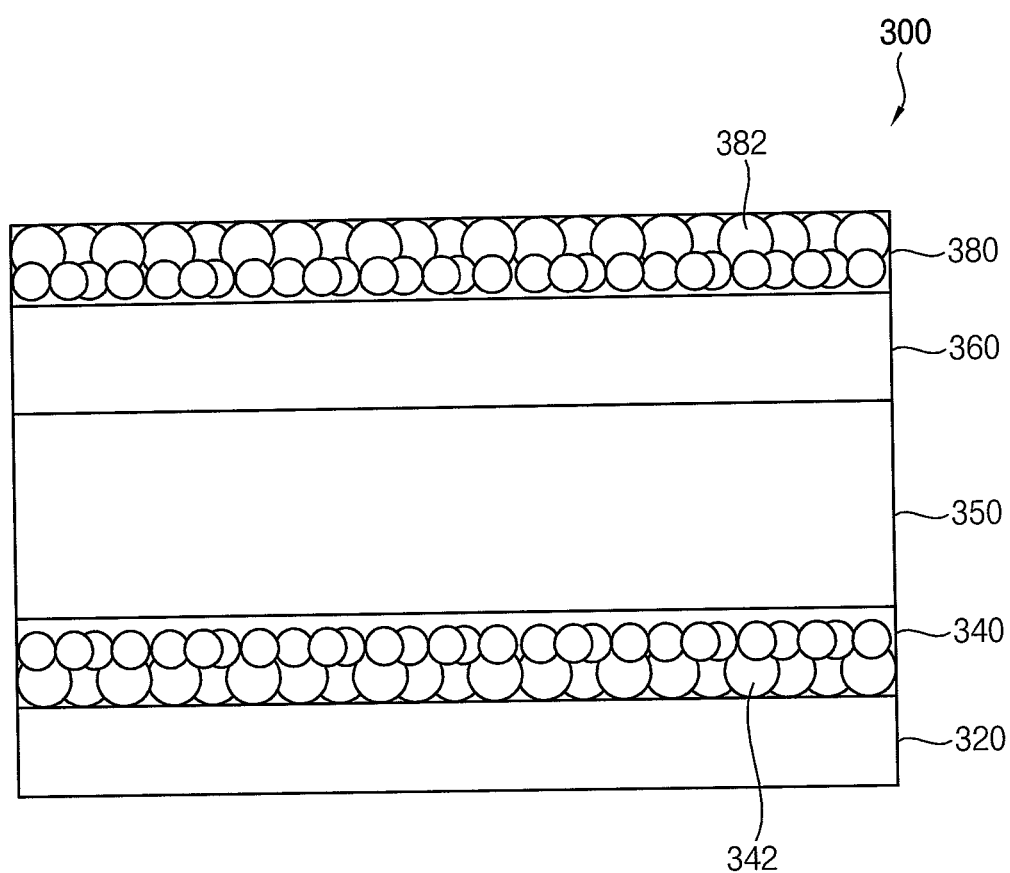
FIG. 8 is a cross-sectional diagram illustrating a flexible display window according to example embodiments.
Figure 9:
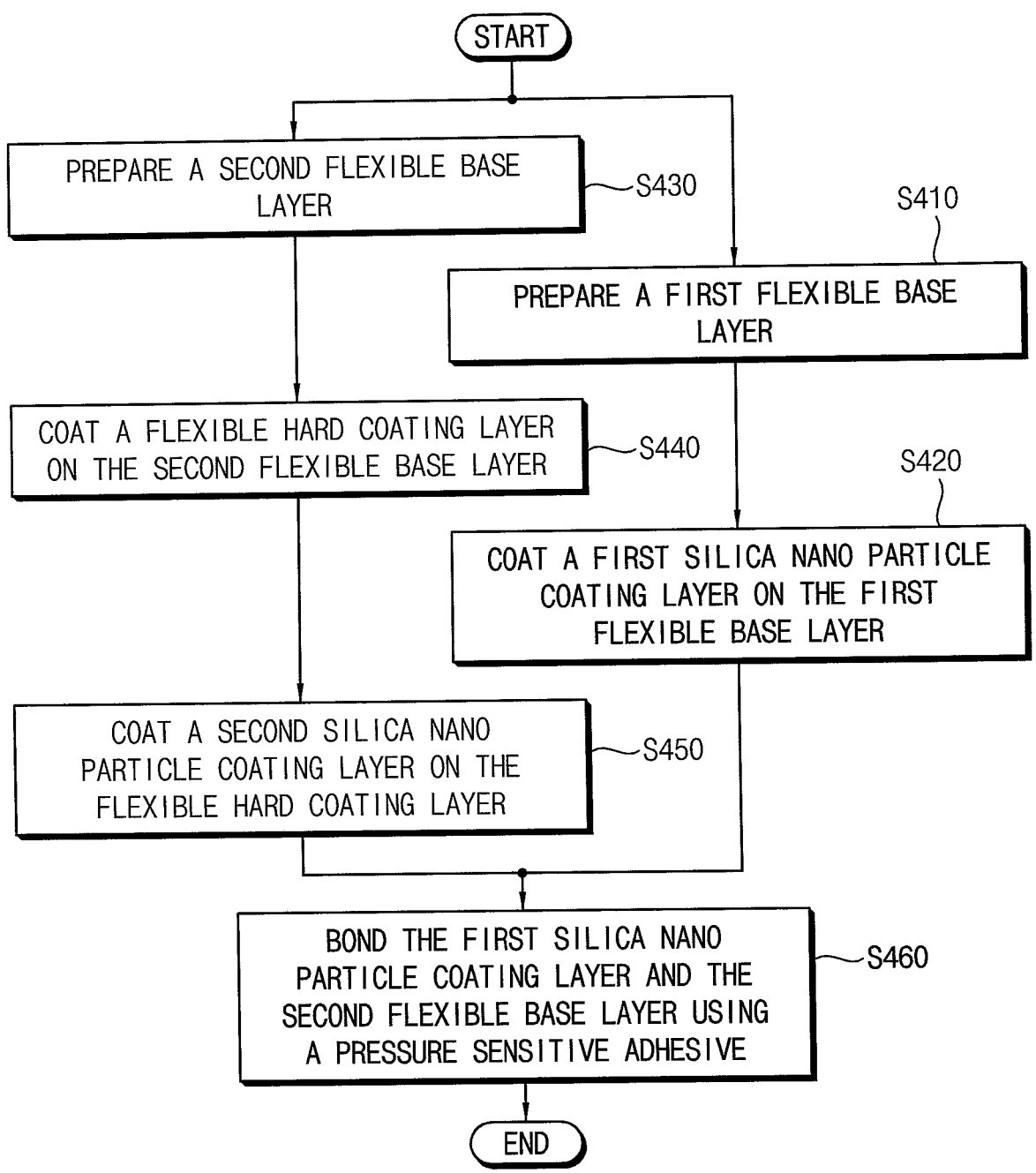
FIG. 9 is a flow chart illustrating an example in which the flexible display window of FIG. 8 is manufactured.
Figure 10:
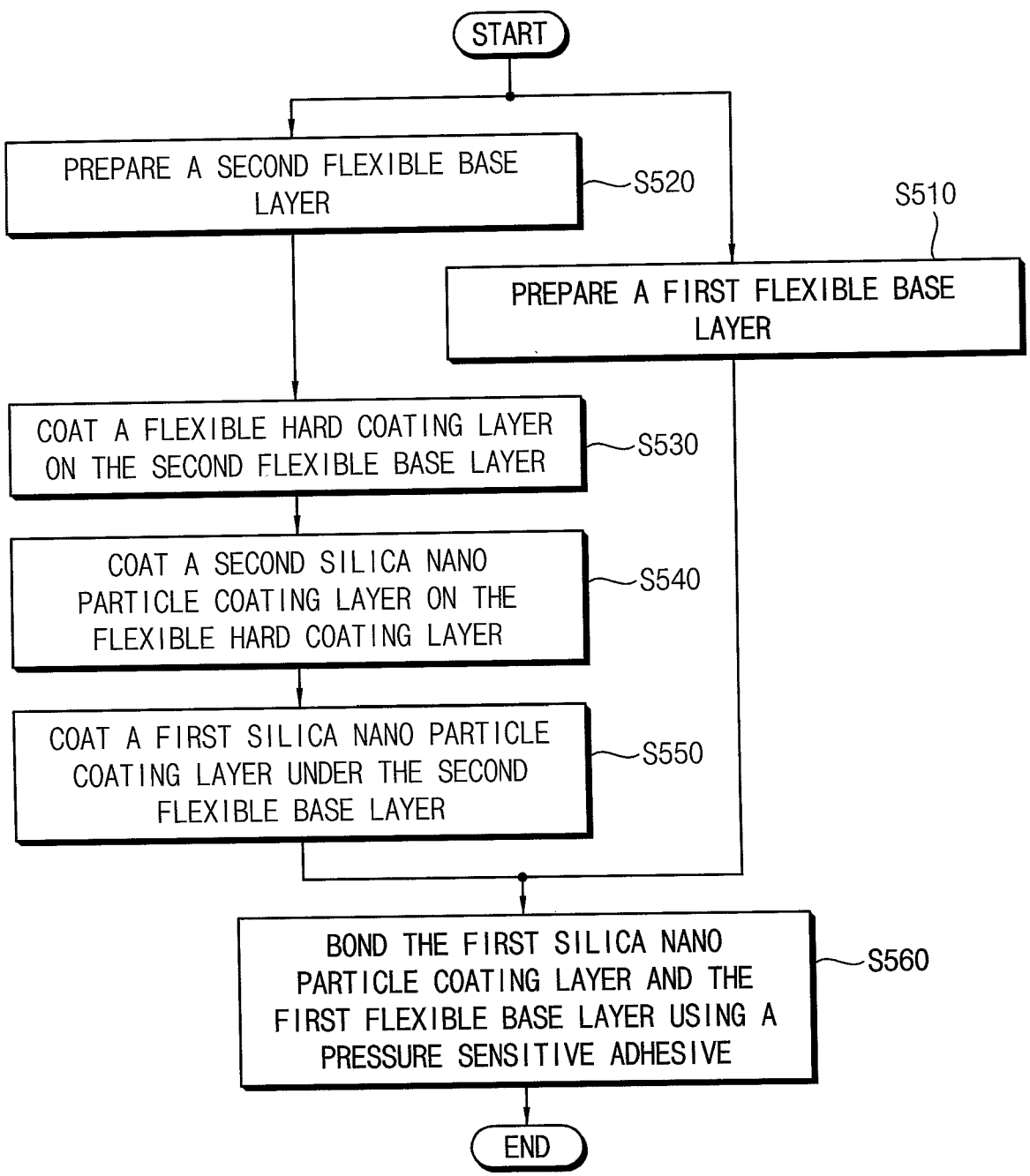
FIG. 10 is a flow chart illustrating another example in which the flexible display window of FIG. 8 is manufactured.

FIG. 8 is a cross-sectional diagram illustrating a flexible display window according to example embodiments. FIG. 9 is a flow chart illustrating an example in which the flexible display window of FIG. 8 is manufactured. FIG. 10 is a flow chart illustrating another example in which the flexible display window of FIG. 8 is manufactured.

Referring to FIGS. 8-10, the flexible display window 300 may include a first flexible base layer 320, a first silica nano particle coating layer 340, a second flexible base layer 350, a flexible hard coating layer 360, and a second silica nano particle coating layer 380. For example, the flexible display window 300 may be manufactured to have an entire (e.g., total) transmittance of more than 90% of visible light and a haze of less than 1%. Since the flexible display window 300 of FIG. 8 has a structure in which the flexible hard coating layer 360 is added to a structure of the flexible display window 200 of FIG. 5, duplicated description of the structure of the flexible display window 200 of FIG. 5 will not be repeated here.

The first flexible base layer 320 may include a first flexible resin to be flexible. In example embodiments, the first flexible base layer 320 may have a single-layer structure or a multi-layer structure. The first silica nano particle coating layer 340 may be disposed on the first flexible base layer 320. Here, the first silica nano particle coating layer 340 may include full-type silica nano particles 342. The first silica nano particle coating layer 340 may enhance impact-resistance of the flexible display window 300 based on the full-type silica nano particles 342. The second flexible base layer 350 may be disposed on the first silica nano particle coating layer 340. Here, the second flexible base layer 350 may include a second flexible resin to be flexible. In example embodiments, the second flexible base layer 350 may have a single-layer structure or a multi-layer structure. Here, the second flexible resin of the second flexible base layer 350 may be different from or identical to the first flexible resin of the first flexible base layer 320. The flexible hard coating layer 360 may be disposed on the second flexible base layer 350. Here, the flexible hard coating layer 360 may include a flexible hard coating resin. For example, the flexible hard coating resin may include an acrylic compound, a urethane compound, a silicon compound, or a combination thereof. In some example embodiments, the flexible hard coating layer 360 may be formed by a dipping coating method, a spin coating method, a spray coating method, a vacuum evaporation method, etc. In example embodiments, the flexible hard coating layer 360 may have a single-layer structure or a multi-layer structure. The second silica nano particle coating layer 380 may be disposed on the flexible hard coating layer 360. Here, the second silica nano particle coating layer 380 may include hollow-type silica nano particles 382. The second silica nano particle coating layer 380 may reduce reflectivity of the flexible display window 300 as well as enhance the impact-resistance of the flexible display window 300 based on the hollow-type silica nano particles 382. In an example embodiment, in order to further enhance the impact-resistance of the flexible display window 300, the second silica nano particle coating layer 380 may include both the hollow-type silica nano particles 382 and the full-type silica nano particles 342.

In brief, the flexible display window 300 may have a coating structure in which the first silica nano particle coating layer 340 including the full-type silica nano particles 342 and the second silica nano particle coating layer 380 including the hollow-type silica nano particles 382 are stacked with the second flexible base layer 350 and the flexible hard coating layer 360 interposed therebetween, where the first and second silica nano particle coating layers 340 and 380 are disposed over the first flexible base layer 320. Thus, although components (e.g., including the flexible display window 300) of the flexible display are made of the plastic-based materials and the flexible display window 300 includes a hard coating layer, the flexible display window 300 may enhance the impact-resistance of the flexible display while reducing the reflectivity of the flexible display based on the first silica nano particle coating layer 340 including the full-type silica nano particles 342 and the second silica nano particle coating layer 380 including the hollow-type silica nano particles 382. In an example embodiment, as illustrated in FIG. 9, the flexible display window 300 may be manufactured by preparing the first flexible base layer 320 (S410), by coating the first silica nano particle coating layer 340 on the first flexible base layer 320 (S420), by preparing the second flexible base layer 350 (S430), by coating the flexible hard coating layer 360 on the second flexible base layer 350 (S440), by coating the second silica nano particle coating layer 380 on the flexible hard coating layer 360 (S450), and by bonding the first silica nano particle coating layer 340 and the second flexible base layer 350 using a pressure sensitive adhesive (S460). In another example embodiment, as illustrated in FIG. 10, the flexible display window 300 may be manufactured by preparing the first flexible base layer 320 (S510), by preparing the second flexible base layer 350 (S520), by coating the flexible hard coating layer 360 on the second flexible base layer 350 (S530), by coating the second silica nano particle coating layer 380 on the flexible hard coating layer 360 (S540), by coating the first silica nano particle coating layer 340 under the second flexible base layer 350 (S550), and by bonding the first silica nano particle coating layer 340 and the first flexible base layer 320 using a pressure sensitive adhesive (S560). Here, the Step S550 may be performed before the Step S530 and/or the Step S540. Since the above-described methods are examples, a method of manufacturing the flexible display window 300 may be changed according to requirements.

Figure 11:
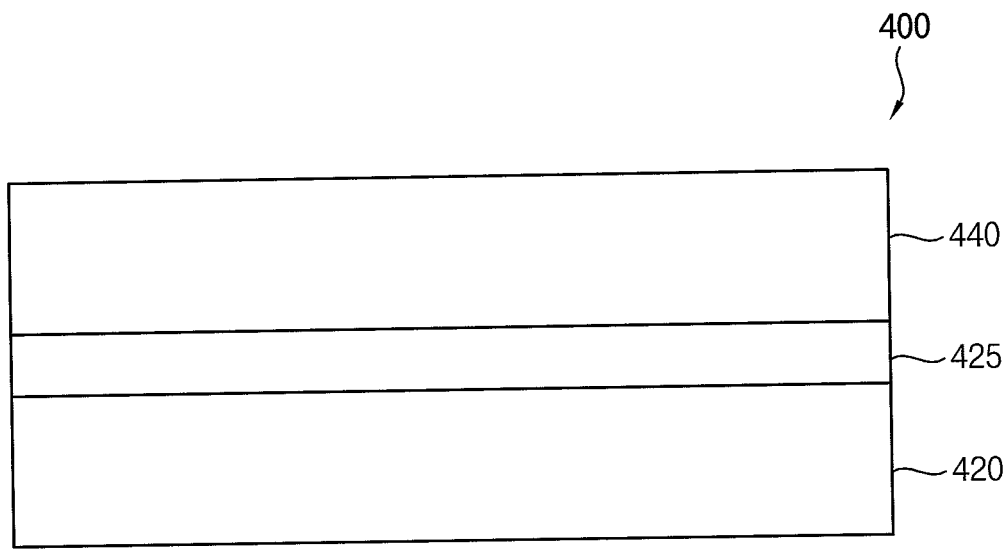
FIG. 11 is a cross-sectional diagram illustrating a flexible display according to example embodiments.
Figure 12:
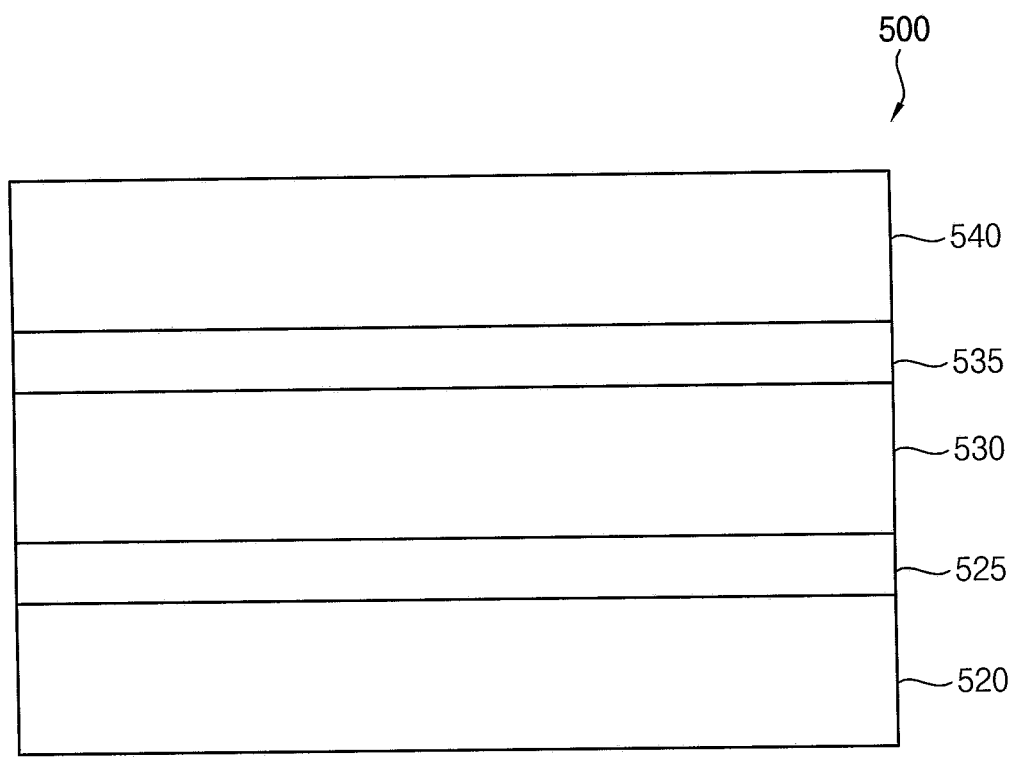
FIG. 12 is a cross-sectional diagram illustrating an example in which the flexible display of FIG. 11 includes a flexible touch panel.
Figure 13:
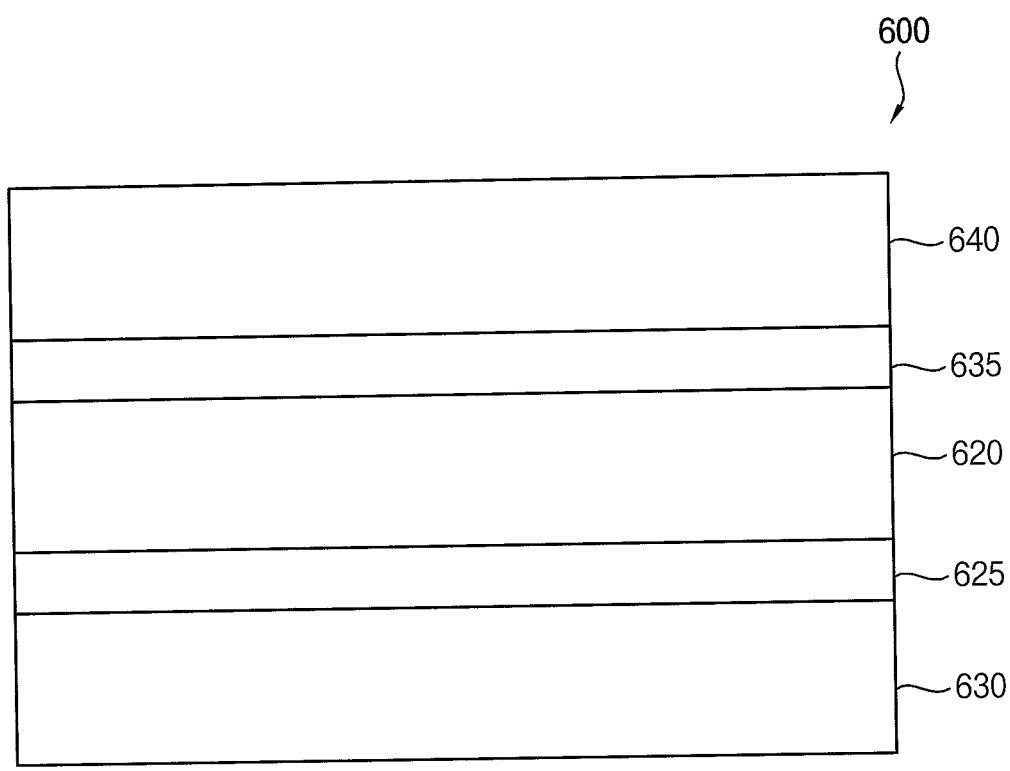
FIG. 13 is a cross-sectional diagram illustrating another example in which the flexible display of FIG. 11 includes a flexible touch panel.

FIG. 11 is a cross-sectional diagram illustrating a flexible display according to example embodiments. FIG. 12 is a cross-sectional diagram illustrating an example in which the flexible display of FIG. 11 includes a flexible touch panel. FIG. 13 is a cross-sectional diagram illustrating another example in which the flexible display of FIG. 11 includes a flexible touch panel.

Referring to FIGS. 11-13, various examples of the flexible display 400, 500, and 600 are illustrated in FIGS. 11-13. Although it is illustrated in FIGS. 11-13 that the flexible display 400, 500, and 600 includes a flexible display panel 420, 520, and 620 and a flexible display window 440, 540, and 640 or includes a flexible display panel 420, 520, and 620, a flexible touch panel 530 and 630, and a flexible display window 440, 540, and 640, the flexible display 400, 500, and 600 may further include other components. For example, the flexible display 400, 500, and 600 may further include a polarizing plate, which implements polarization of internal light, prevents reflection of external light (or reduces such reflection), and increases a contrast ratio of the flexible display 400, 500, and 600. In an example embodiment, as illustrated in FIG. 11, the flexible display 400 may include the flexible display panel 420 and the flexible display window 440 that is disposed on the flexible display panel 420. Here, the flexible display panel 420 and the flexible display window 440 may be bonded using a pressure sensitive adhesive 425. The flexible display panel 420 may include a substrate that is made of a flexible resin to be flexible. The flexible display panel 420 may include an organic light emitting element, a liquid crystal element, etc. For example, the flexible resin of the flexible display panel 420 may be a polyethylene terephthalate resin, a polyvinyl chloride resin, a polycarbonate resin, a polyimide resin, a polystyrene resin, a polyacrylate resin, a polyurethane resin, a silicon resin, etc. The flexible display window 440 may be disposed (or, formed) at the outermost portion of the flexible display 400 to protect the flexible display panel 420.

In some example embodiments, the flexible display 500 and 600 may include the flexible touch panel 530 and 630 that generates an electric signal by detecting (or, sensing) capacitance-change caused when a human body, a stylus pen, etc. contact. Here, the flexible touch panel 530 and 630 may be formed by patterning an electric conductor. Here, the electric conductor may be flexible. The electric conductor may include a metal nano wire, a conductive polymer, a carbon nano tube, etc. In example embodiments, the flexible touch panel 530 and 630 may include a substrate that is made of a flexible resin to be flexible. For example, the flexible resin of the flexible touch panel 530 and 630 may be a polyethylene terephthalate resin, a polyvinyl chloride resin, a polycarbonate resin, a polyimide resin, a polystyrene resin, a polyacrylate resin, a polyurethane resin, a silicon resin, etc. In an example embodiment, as illustrated in FIG. 12, the flexible display 500 may include the flexible display panel 520, the flexible touch panel 530 that is disposed on the flexible display panel 520, and the flexible display window 540 that is disposed on the flexible touch panel 530. Here, the flexible display panel 520, the flexible touch panel 530, and the flexible display window 540 may be stacked (or, bonded) using pressure adhesives 525 and 535. In another example embodiment, as illustrated in FIG. 13, the flexible display 600 may include the flexible display panel 620, the flexible touch panel 630 that is disposed under the flexible display panel 620, and the flexible display window 640 that is disposed on the flexible display panel 620. Here, the flexible display panel 620, the flexible touch panel 630, and the flexible display window 640 may be stacked using pressure adhesives 625 and 635.

The flexible display window 440, 540, and 640 may have a coating structure that includes a first silica nano particle coating layer including full-type silica nano particles and a second silica nano particle coating layer including hollow-type silica nano particles. In an example embodiment, the flexible display window 440, 540, and 640 may include a flexible base layer including a flexible resin, a first silica nano particle coating layer including full-type silica nano particles, where the first silica nano particle coating layer is disposed on the flexible base layer, a flexible hard coating layer including a flexible hard coating resin, where the flexible hard coating layer is disposed on the first silica nano particle coating layer, and a second silica nano particle coating layer including hollow-type silica nano particles, where the second silica nano particle coating layer is disposed on the flexible hard coating layer. In some example embodiments, the second silica nano particle coating layer may further include the full-type silica nano particles. In another example embodiment, the flexible display window 440, 540, and 640 may include a first flexible base layer including a first flexible resin, a first silica nano particle coating layer including full-type silica nano particles, where the first silica nano particle coating layer is disposed on the first flexible base layer, a second flexible base layer including a second flexible resin, where the second flexible base layer is disposed on the first silica nano particle coating layer, and a second silica nano particle coating layer including hollow-type silica nano particles, where the second silica nano particle coating layer is disposed on the second flexible base layer. In some example embodiments, the second silica nano particle coating layer may further include the full-type silica nano particles. In still another example embodiment, the flexible display window 440, 540, and 640 may include a first flexible base layer including a first flexible resin, a first silica nano particle coating layer including full-type silica nano particles, where the first silica nano particle coating layer is disposed on the first flexible base layer, a second flexible base layer including a second flexible resin, where the second flexible base layer is disposed on the first silica nano particle coating layer, a flexible hard coating layer including a flexible hard coating resin, where the flexible hard coating layer is disposed on the second flexible base layer, and a second silica nano particle coating layer including hollow-type silica nano particles, where the second silica nano particle coating layer is disposed on the flexible hard coating layer. In some example embodiments, the second silica nano particle coating layer may further include the full-type silica nano particles. Thus, the flexible display 400, 500, and 600 including the flexible display window 440, 540, and 640 may achieve reduced reflectivity and enhanced impact-resistance. Since these are described above, duplicated description thereof will not be repeated here.

Figure 14:
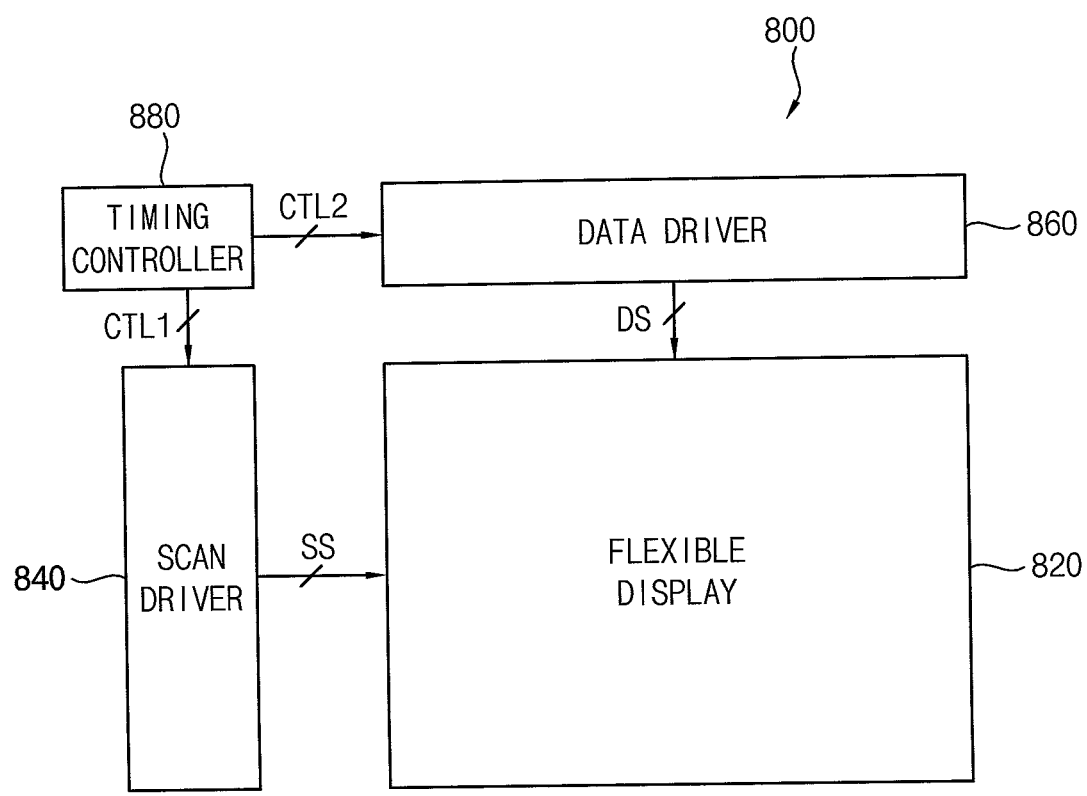
FIG. 14 is a block diagram illustrating a flexible display device according to example embodiments.

FIG. 14 is a block diagram illustrating a flexible display device according to example embodiments.

Referring to FIG. 14, the flexible display device 800 may include a flexible display 820, a scan driver 840, a data driver 860, and a timing controller 880. Here, the flexible display device 800 may perform a bending operation (e.g., an operation by which the flexible display device 800 is bent and unbent), a folding operation (e.g., an operation by which the flexible display device 800 is folded and unfolded), etc. based on the flexible display 820 having flexibility. In an example embodiment, the flexible display device 800 may be an organic light emitting display (OLED) device. In this case, each pixel included in a flexible display panel of the flexible display 820 may include transistors and an organic light emitting element. In another example embodiment, the flexible display device 800 may be a liquid crystal display (LCD) device. In this case, each pixel included in the flexible display panel of the flexible display 820 may include transistors and a liquid crystal element. Since these are examples, the flexible display device 800 is not limited to the OLED device and the LCD device.

The flexible display 820 may include a plurality of pixels. Since the flexible display 820 has the flexibility, the flexible display 820 may perform the bending operation, the folding operation, etc. In the flexible display 820, the pixels may be arranged at locations corresponding to crossing points between scan-lines and data-lines. Thus, when the number of the scan-lines is a and the number of the data-lines is b, the flexible display 820 may include a×b pixels. In example embodiments, the flexible display 820 may include a flexible display panel and a flexible display window or may include a flexible display panel, a flexible touch panel, and a flexible display window. However, the flexible display 820 may further include components other than the flexible display panel, the flexible touch panel, and the flexible display window. In example embodiments, the flexible display window included in the flexible display 820 may have a coating structure in which a first silica nano particle coating layer including full-type silica nano particles and a second silica nano particle coating layer including hollow-type silica nano particles are stacked with a set (or specific) layer (e.g., a flexible hard coating layer and/or another flexible base layer) interposed therebetween, where the first and second silica nano particle coating layers are disposed over a flexible base layer. In some example embodiments, the second silica nano particle coating layer may further include the full-type silica nano particles. Since the coating structure is described above with reference to FIGS. 1, 5, and 8, duplicated description thereof will not be repeated here. Thus, the flexible display window may enhance impact-resistance of the flexible display 820 while reducing reflectivity of the flexible display 820 based on the first silica nano particle coating layer including the full-type silica nano particles and the second silica nano particle coating layer including the hollow-type silica nano particles. As a result, the flexible display 820 including the flexible display window may achieve reduced reflectivity and enhanced impact-resistance.

The flexible display 820 may be coupled to (e.g., connected to) the scan driver 840 via the scan-lines and may be coupled to (e.g., connected to) the data driver 860 via the data-lines. The scan driver 840 may provide a scan signal SS to the flexible display 820 via the scan-lines. The data driver 860 may provide a data signal DS corresponding to image data to the flexible display 820 via the data-lines. The timing controller 880 may control the scan driver 840 and the data driver 860 by providing control signals CTL1 and CTL2 to the scan driver 840 and the data driver 860. As described above, the flexible display 820 that includes the flexible display window having the coating structure may effectively disperse an external impact (e.g., an impact that is caused when the bending operation, the folding operation, etc. are performed, an impact that is caused when an object contacts the flexible display 820, etc.) based on the coating structure when the external impact is applied to the flexible display 820. Thus, the flexible display device 800 including the flexible display 820 may achieve high reliability and high durability. In addition, the flexible display 820 that includes the flexible display window having the coating structure may effectively reduce its reflectivity based on the coating structure. Thus, the flexible display device 800 including the flexible display 820 may provide a high-quality image to a user (or, viewer). Although it is described above that the flexible display device 800 includes the flexible display 820, the scan driver 840, the data driver 860, and the timing controller 880, it should be understood that the flexible display device 800 may further include components (e.g., a power supply that provides various voltages to the flexible display 820, the scan driver 840, the data driver 860, and the timing controller 880) other than the flexible display 820, the scan driver 840, the data driver 860, and the timing controller 880.

Figure 15:
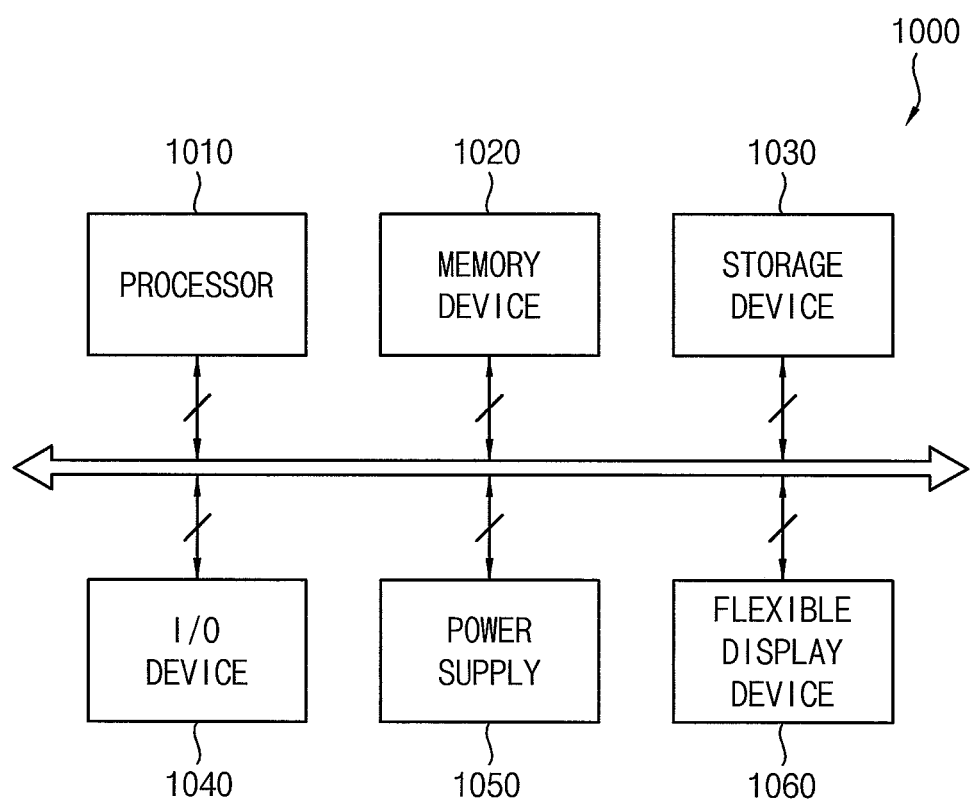
FIG. 15 is a block diagram illustrating an electronic device according to example embodiments.
Figure 16:
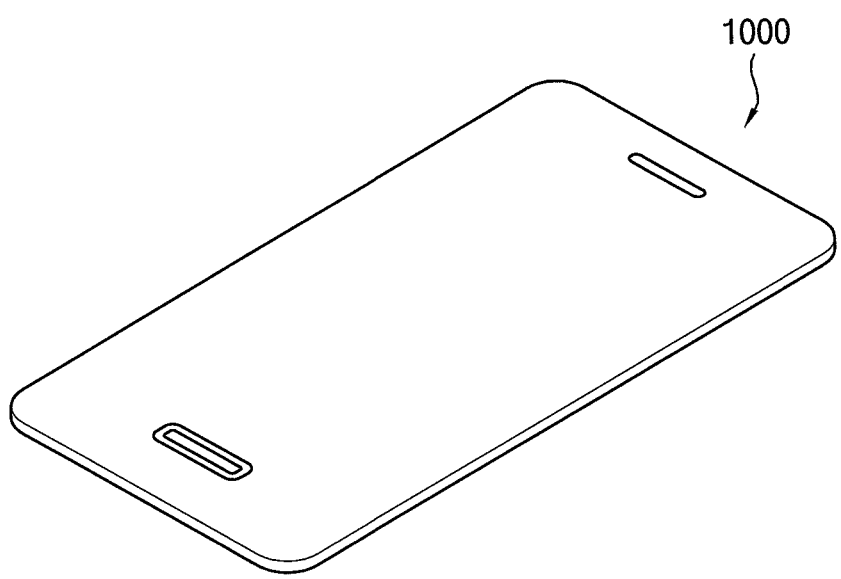
FIG. 16 is a diagram illustrating an example in which the electronic device of FIG. 15 is implemented as a smart phone.

FIG. 15 is a block diagram illustrating an electronic device according to example embodiments. FIG. 16 is a diagram illustrating an example in which the electronic device of FIG. 15 is implemented as a smart phone.

Referring to FIGS. 15-16, the electronic device 1000 may include a processor 1010, a memory device 1020, a storage device 1030, an input/output (I/O) device 1040, a power supply 1050, and a flexible display device 1060. Here, the flexible display device 1060 may be the flexible display device 800 of FIG. 14. The electronic device 1000 may further include a plurality of ports for communicating with a video card, a sound card, a memory card, a universal serial bus (USB) device, other electronic devices, etc. In an example embodiment, as illustrated in FIG. 16, the electronic device 1000 may be implemented as a smart phone. However, the electronic device 1000 is not limited thereto. For example, the electronic device 1000 may be implemented as a cellular phone, a video phone, a smart pad, a smart watch, a tablet PC, a car navigation system, a computer monitor, a laptop, a television, a head mounted display (HMD) device, etc.

The processor 1010 may perform various suitable computing functions. The processor 1010 may be a micro processor, a central processing unit (CPU), an application processor (AP), etc. The processor 1010 may be coupled to other components via an address bus, a control bus, a data bus, etc. Further, the processor 1010 may be coupled to an extended bus such as a peripheral component interconnection (PCI) bus. The memory device 1020 may store data for operations of the electronic device 1000. For example, the memory device 1020 may include at least one non-volatile memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, etc., and/or at least one volatile memory device such as a dynamic random access memory (DRAM) device, a static random access memory (SRAM) device, a mobile DRAM device, etc. The storage device 1030 may include a solid state drive (SSD) device, a hard disk drive (HDD) device, a CD-ROM device, etc. The I/O device 1040 may include an input device such as a keyboard, a keypad, a mouse device, a touchpad, a touch-screen, etc., and an output device such as a printer, a speaker, etc. In some example embodiments, the flexible display device 1060 may be included in the I/O device 1040. The power supply 1050 may provide power for operations of the electronic device 1000.

The flexible display device 1060 may be coupled to other components via the buses or other communication links. In some example embodiments, the flexible display device 1060 may be an organic light emitting display device or a liquid crystal display device. However, the flexible display device 1060 is not limited thereto. As described above, the flexible display device 1060 may provide image information to a viewer (or, user) using a flexible display having low reflectivity and high impact-resistance. To this end, the flexible display device 1060 may include the flexible display, a scan driver, a data driver, a timing controller, etc. According to example embodiments, the flexible display may include a flexible display panel and a flexible display window or may include a flexible display panel, a flexible touch panel, and a flexible display window. Here, the flexible display window may have a coating structure in which a first silica nano particle coating layer including full-type silica nano particles and a second silica nano particle coating layer including hollow-type silica nano particles are stacked with a set (or specific) layer (e.g., a flexible hard coating layer and/or another flexible base layer) interposed therebetween, where the first and second silica nano particle coating layers are disposed over a flexible base layer. In some example embodiments, the second silica nano particle coating layer may further include the full-type silica nano particles. Thus, the flexible display window may enhance the impact-resistance of the flexible display while reducing the reflectivity of the flexible display based on the first silica nano particle coating layer including the full-type silica nano particles and the second silica nano particle coating layer including the hollow-type silica nano particles. As a result, the flexible display including the flexible display window may achieve reduced reflectivity and enhanced impact-resistance. Since these are described above, duplicated description thereof will not be repeated here.

The subject matter of the present disclosure may be applied to a flexible display device and an electronic device including the flexible display device. For example, the subject matter of the present disclosure may be applied to a cellular phone, a smart phone, a video phone, a smart pad, a smart watch, a tablet PC, a car navigation system, a television, a computer monitor, a laptop, a HMD device, etc.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, acts, operations, elements, and/or components, but do not preclude the presence or addition of one or more other features, integers, acts, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the terms "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

The foregoing is illustrative of example embodiments and is not to be construed as limiting thereof. Although a few example embodiments have been described, those skilled in the art will readily appreciate that many modifications are possible in the example embodiments without materially departing from the novel features of the subject matter of the present disclosure. Accordingly, all such modifications are intended to be included within the scope of the present disclosure as defined in the claims, and equivalents thereof. Therefore, it is to be understood that the foregoing is illustrative of various example embodiments and is not to be construed as limited to the example embodiments disclosed herein, and that modifications to the disclosed example embodiments, as well as other example embodiments, are intended to be included within the scope of the appended claims, and equivalents thereof.

What is claimed is:

1. A flexible display window comprising:
   a flexible base layer comprising a flexible resin;
   a first silica nano particle coating layer comprising full-type silica nano particles, the first silica nano particle coating layer being disposed on the flexible base layer;
   a flexible hard coating layer comprising a flexible hard coating resin, the flexible hard coating layer being disposed on the first silica nano particle coating layer; and
   a second silica nano particle coating layer comprising hollow-type silica nano particles, the second silica nano particle coating layer being disposed on the flexible hard coating layer,
   wherein the flexible hard coating layer is interposed between the first silica nano particle coating layer and the second silica nano particle coating layer.

2. The flexible display window of claim 1, wherein the second silica nano particle coating layer further comprises the full-type silica nano particles.

3. The flexible display window of claim 1, wherein the flexible base layer has a single-layer structure.

4. The flexible display window of claim 1, wherein the flexible base layer has a multi-layer structure.

5. The flexible display window of claim 1, wherein the flexible hard coating layer has a single-layer structure.

6. The flexible display window of claim 1, wherein the flexible hard coating layer has a multi-layer structure.

7. The flexible display window of claim 1, wherein the flexible resin comprises at least one selected from a polyethylene terephthalate resin, a polyvinyl chloride resin, a polycarbonate resin, a polyimide resin, a polystyrene resin, a polyacrylate resin, a polyurethane resin, and a silicon resin.

8. A flexible display window comprising:
a first flexible base layer comprising a first flexible resin;
a first silica nano particle coating layer comprising full-type silica nano particles, the first silica nano particle coating layer being disposed on the first flexible base layer;
a second flexible base layer comprising a second flexible resin, the second flexible base layer being disposed on the first silica nano particle coating layer; and
a second silica nano particle coating layer comprising hollow-type silica nano particles, the second silica nano particle coating layer being disposed on the second flexible base layer,
wherein the second flexible base layer is interposed between the first silica nano particle coating layer and the second silica nano particle coating layer.

9. The flexible display window of claim 8, wherein the second silica nano particle coating layer further comprises the full-type silica nano particles.

10. The flexible display window of claim 8, wherein the first flexible base layer has a single-layer structure.

11. The flexible display window of claim 8, wherein the first flexible base layer has a multi-layer structure.

12. The flexible display window of claim 8, wherein the second flexible base layer has a single-layer structure.

13. The flexible display window of claim 8, wherein the second flexible base layer has a multi-layer structure.

14. A flexible display window comprising:
a first flexible base layer comprising a first flexible resin;
a first silica nano particle coating layer comprising full-type silica nano particles, the first silica nano particle coating layer being disposed on the first flexible base layer;
a second flexible base layer comprising a second flexible resin, the second flexible base layer being disposed on the first silica nano particle coating layer;
a flexible hard coating layer comprising a flexible hard coating resin, the flexible hard coating layer being disposed on the second flexible base layer; and
a second silica nano particle coating layer comprising hollow-type silica nano particles, the second silica nano particle coating layer being disposed on the flexible hard coating layer,
wherein the second flexible base layer and the flexible hard coating layer are interposed between the first silica nano particle coating layer and the second silica nano particle coating layer.

15. The flexible display window of claim 14, wherein the second silica nano particle coating layer further comprises the full-type silica nano particles.

16. The flexible display window of claim 14, wherein the first flexible base layer has a single-layer structure.

17. The flexible display window of claim 14, wherein the first flexible base layer has a multi-layer structure.

18. The flexible display window of claim 14, wherein the second flexible base layer has a single-layer structure.

19. The flexible display window of claim 14, wherein the second flexible base layer has a multi-layer structure.

20. The flexible display window of claim 14, wherein the flexible hard coating layer has a single-layer structure.

21. The flexible display window of claim 14, wherein the flexible hard coating layer has a multi-layer structure.

22. A flexible display comprising:
a flexible display panel; and
a flexible display window having a coating structure that comprises a first silica nano particle coating layer comprising full-type silica nano particles and a second silica nano particle coating layer comprising hollow-type silica nano particles, the flexible display window being disposed on the flexible display panel,
wherein a target layer is interposed between the first silica nano particle coating layer and the second silica nano particle coating layer.

23. The flexible display of claim 22, further comprising:
a flexible touch panel disposed between the flexible display panel and the flexible display window or disposed under the flexible display panel.

24. The flexible display of claim 23, wherein the flexible display panel, the flexible touch panel, and the flexible display window are stacked using pressure sensitive adhesives.

25. The flexible display of claim 22, the flexible display window comprises:
a flexible base layer comprising a flexible resin;
the first silica nano particle coating layer disposed on the flexible base layer; and
the second silica nano particle coating layer disposed on the flexible hard coating layer,
wherein the flexible hard coating layer composes the target layer.

26. The flexible display of claim 25, wherein the second silica nano particle coating layer further comprises the full-type silica nano particles.

27. The flexible display of claim 22, the flexible display window comprises:
a first flexible base layer comprising a first flexible resin;
the first silica nano particle coating layer disposed on the first flexible base layer;
a second flexible base layer comprising a second flexible resin, the second flexible base layer being disposed on the first silica nano particle coating layer; and
the second silica nano particle coating layer disposed on the second flexible base layer,
wherein the second flexible base layer composes the target layer.

28. The flexible display of claim 27, wherein the second silica nano particle coating layer further comprises the full-type silica nano particles.

29. The flexible display of claim 22, the flexible display window comprises:
a first flexible base layer comprising a first flexible resin;
the first silica nano particle coating layer disposed on the first flexible base layer;
a second flexible base layer comprising a second flexible resin, the second flexible base layer being disposed on the first silica nano particle coating layer;
a flexible hard coating layer comprising a flexible hard coating resin, the flexible hard coating layer being disposed on the second flexible base layer; and
the second silica nano particle coating layer disposed on the flexible hard coating layer,
wherein the second flexible base layer and the flexible hard coating layer compose the target layer.

30. The flexible display of claim 29, wherein the second silica nano particle coating layer further comprises the full-type silica nano particles.

* * * * *